United States Patent [19]

Mita et al.

[11] Patent Number: 5,428,889
[45] Date of Patent: Jul. 4, 1995

[54] METHOD FOR MANUFACTURING COMPOSITE LEAD FRAME

[75] Inventors: Mamoru Mita; Tomio Murakami; Shoji Takagi, all of Ibaraki; Hiroki Tanaka, Osaka; Kenji Yamaguchi, Ibaraki, all of Japan

[73] Assignee: Hitachi Cable, Ltd., Tokyo, Japan

[21] Appl. No.: 998,917

[22] Filed: Dec. 30, 1992

Related U.S. Application Data

[62] Division of Ser. No. 942,656, Sep. 9, 1992, Pat. No. 5,326,990.

[51] Int. Cl.⁶ .......................................... H01R 43/00
[52] U.S. Cl. .................................... 29/827; 437/209; 437/217
[58] Field of Search ............... 437/209, 217; 29/827, 29/840; 257/700, 701, 703

[56] References Cited

U.S. PATENT DOCUMENTS 4,237,607 12/1980 Ohno .................................. 29/840
4,246,697 1/1981 Smith ................................. 28/827

FOREIGN PATENT DOCUMENTS

| 54-101262 | 8/1979 | Japan | 437/209 |
| 55-140238 | 11/1980 | Japan | 437/209 |
| 56-161663 | 12/1981 | Japan | 437/209 |
| 63-285943 | 11/1988 | Japan | 437/209 |
| 1-245534 | 9/1989 | Japan | 437/209 |
| 4-84449 | 3/1992 | Japan | . |

OTHER PUBLICATIONS

Abstract of Paper by M. Mita et al. in 1992 Proc 42nd Electronic Components and Technology Conf. 18–20 May 1992 pp. 458–466.

Primary Examiner—Carl J. Arbes
Attorney, Agent, or Firm—Helfgott & Karas

[57] ABSTRACT

An outer lead of a metal lead frame is connected to an inner lead of a flexible lead-patterned substrate via a Au—Sn alloy layer. The Au—Sn alloy layer contains Au of 10 to 40 weight %. An inner lead of a metal lead frame is connected to a patterned lead of a flexible lead-patterned substrate by a heating tool. The inner lead is coated on bottom and side surfaces of its tip portion. The bottom surface faces the patterned lead.

8 Claims, 11 Drawing Sheets

(Au PLATING THICKNESS : 1.0 μm)

FIG. 21

METHOD FOR MANUFACTURING COMPOSITE LEAD FRAME

This is a division of application Ser. No. 942,656, filed Sep. 9, 1992 now U.S. Pat. No. 5,326,990 issued Jul. 5, 1994.

FIELD OF THE INVENTION

The invention relates to a composite lead frame and a method for manufacturing the same, and more particularly to, a composite lead frame which is applied to a resin sealing type semiconductor integrated circuit and a method for manufacturing the same, by which a high connection strength is obtained between conductive lead patterns on an insulation film and leads of a metal lead frame.

BACKGROUND OF THE INVENTION

A composite lead frame comprises a flexible print circuit (FPC) or a tape automated bonding (TAB) tape having an LSI mounting portion and copper foil lead patterns thereon, and a metal lead frame having inner and outer leads supported by a frame member, wherein the inner leads are connected to the copper foil lead patterns on a bonding region.

In connecting the inner leads to the copper foil lead patterns, a junction layer is interposed at each interface of the inner leads and the copper foil lead patterns. The junction layer is, for example, of a Au—Sn alloy. The connection of the inner leads and the copper foil lead patterns is carried out by the steps of mounting the copper foil lead patterns plated with Au on a work stage, placing tip portions of the inner leads plated with Sn on the copper foil lead patterns, and applying heat and pressure on the tip portions of the inner leads by a heating tool. After the heat and pressure applying step, the heating tool is cleaned to remove Sn attached thereto, because the heating tool is contaminated by Sn.

Another type of a composite lead frame comprises a flexible print circuit having inner leads on an insulation film, and a metal lead frame having outer leads supported by a frame member, wherein the inner leads and the outer leads are connected by applying heat and pressure thereto. In one case, the temperature of the heating is set to be lower than a temperature, by which the insulation film is deteriorated.

However, the former and latter composite lead frames have disadvantages in that the productivity is lowered, because the cleaning of the heating tool must be done at each time after the heat and pressure applying step is finished, and the stabilized connection of the inner and outer leads (or the inner leads and the copper foil lead patterns) is not obtained, because a plastic resin is molded to seal an integrated circuit chip mounted on the composite lead frame by a temperature higher than the temperature applyied to the inner and outer leads.

SUMMARY OF THE INVENTION

Accordingly, it is an object of the invention to provide a composite lead frame and a method for manufacturing the same, in which the stabilized connection of the inner and outer leads (or the inner leads and the copper foil lead patterns) is realized without the necessity of the cleaning of the heating tool.

It is another object of the invention to provide a composite lead frame and a method for manufacturing the same, in which the connection having a predetermined strength is realized at a low temperature without deteriorating the insulation film and adhesive for adhering the copper foil lead patterns to the insulation film.

According to the first feature of the invention, a composite lead frame comprises;
  a metal lead frame comprising a frame member, and outer leads integral with said frame member; and
  a flexible lead-patterned substrate comprising an insulation film, and inner leads provided on said insulation film;
  wherein said outer leads of said metal lead frame and said inner leads of said flexible lead-patterned substrate are correspondingly connected via a Au—Sn alloy layers, each of said Au—Sn alloy layers containing 10 to 40 weight % of Au.

According to the second feature of the invention, a method for manufacturing a composite lead frame comprises the steps of:
  providing a plating layer on a bottom surface and a side surface of a tip portion of an inner lead, said inner lead being integral with an outer lead supported by a frame number of a metal lead frame;
  positioning said tip portion of said inner lead on a patterned lead of a flexible lead-patterned substrate, said bottom surface facing said patterned lead of said flexible lead-patterned substrate, and said lead-patterned substrate comprising an insulation film and a plurality of patterned leads including said patterned lead provided on said insulation film; and
  applying heat and pressure across said tip portion of said inner lead and said patterned lead by a heating tool.

BRIEF DESCRIPTION OF THE DRAWINGS

The invention will be explained in more detail in conjunction with appended drawings, wherein.

DESCRIPTION OF THE PREFERRED EMBODIMENTS

Before explaining a composite lead frame and a method for manufacturing the same of preferred embodiments according to the invention, the background of the invention will be again explained in more detail.

Figure 1:
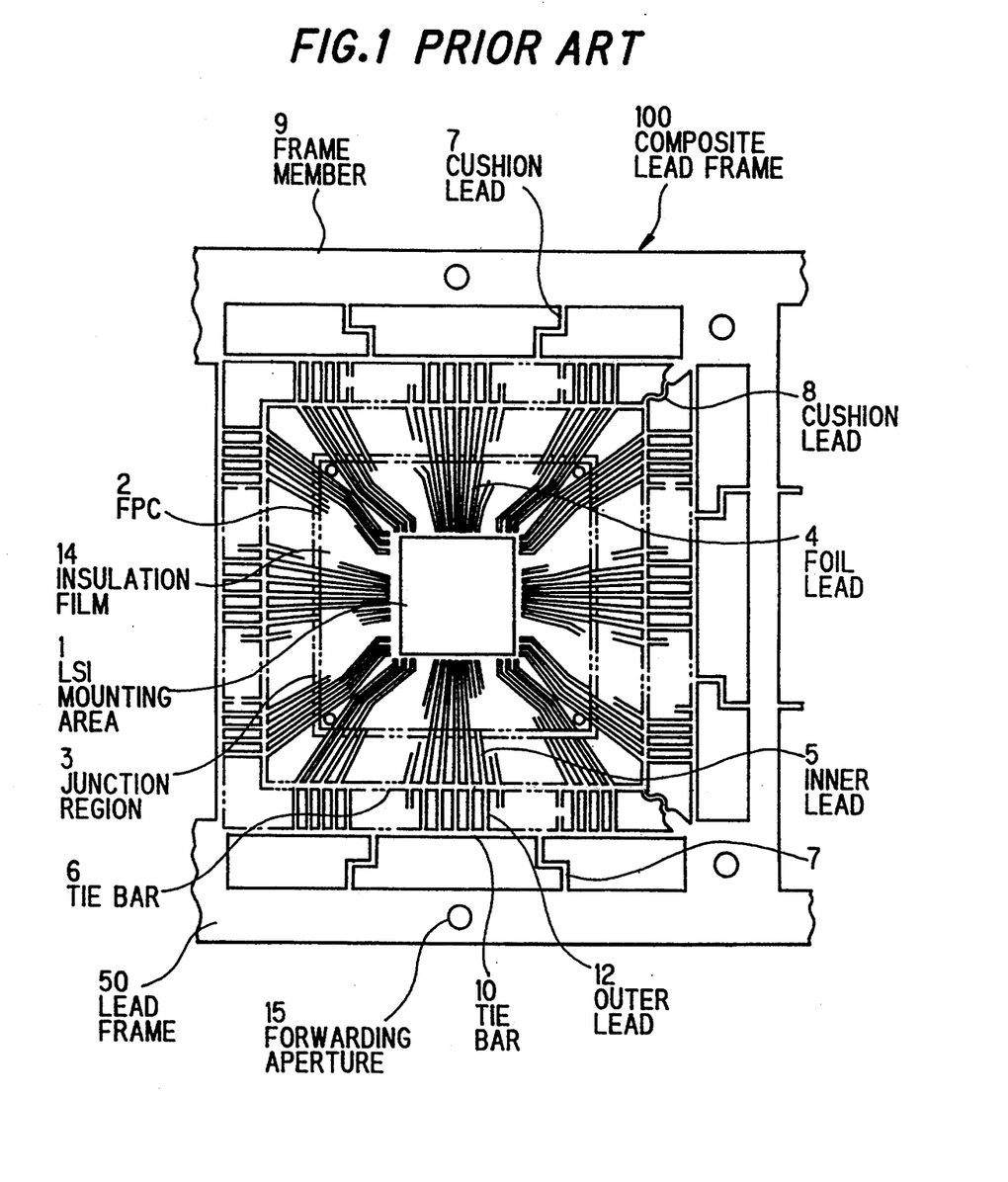
FIG. 1 is a plan view showing a composite lead frame to which the invention relates.

FIG. 1 shows a composite lead frame 100 which comprises an FPC(or TAB tape) 2 and a metal lead frame 50 connected at a junction region 3 to each other.

The FPC 2 comprises an LSI mounting area 1 and patterned copper foil leads 4 provided on an insulation film 14, and the lead frame 50 comprises inner leads 5, outer leads 12, cushion leads 7 and 8, a tie bar 6 for tying the inner and outer leads 5 and 12, a tie bar 10 for tying the outer leads 12 and the cushion leads 7 and 8, and a frame member 9 having position fixing forwarding apertures 15.

In this composite lead frame 100, the connection between the FPC2 and the lead frame 50 is very important for the quality thereof and is realized, for instance, by soldering the inner leads 5 to the copper foil leads 4.

Figure 2:
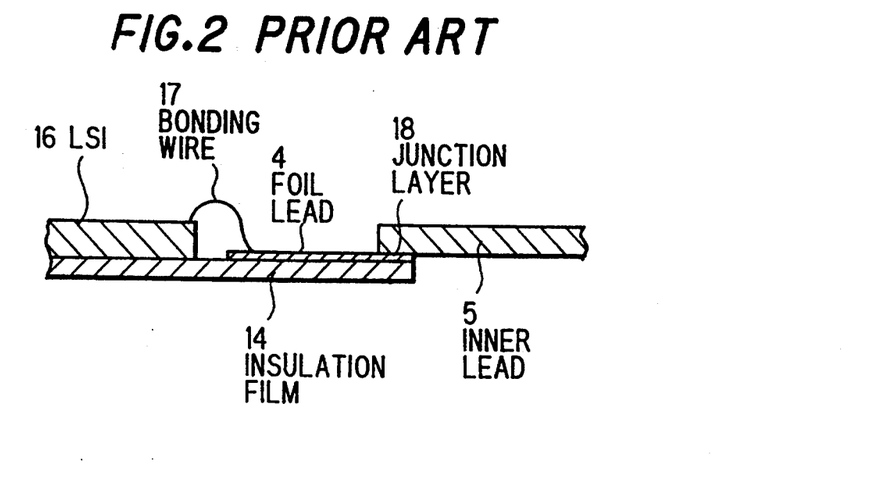
FIG. 2 is a cross sectional view showing a part of a conventional composite lead frame.

FIG. 2 shows one of methods for making a junction of the inner lead 5 with the copper foil lead 4, wherein the insulation film 14 having an LSI 16 and the copper foil lead 4 connected by a bonding wire 17 is positioned on a work stage (not shown), and the inner lead 5 is connected to the copper foil lead 4 by a junction layer 18.

Practically, the junction layer 18 is a layer selected from a solder layer, a conductive paste layer, anisotropic conductive sheet layer, a Au—Sn eutectic layer, a locally heated diffusion layer, etc. which are known in the art.

Figure 3:
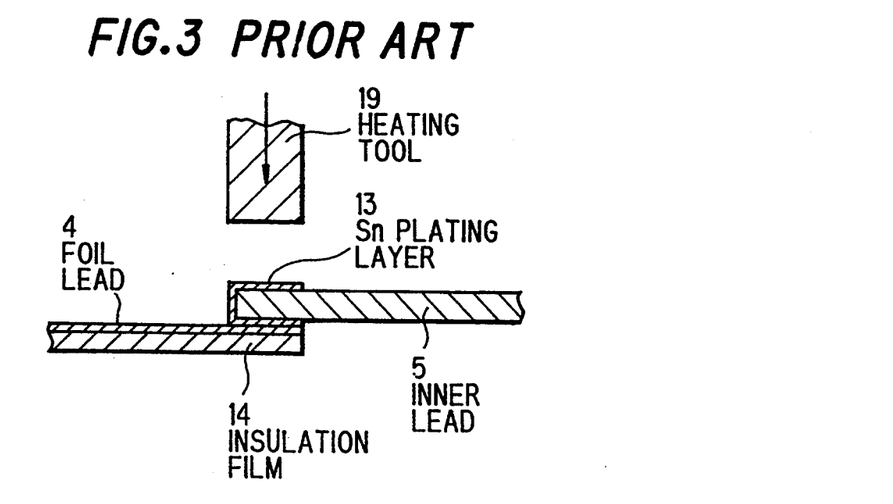
FIG. 3 is a cross sectional view showing a conventional method for manufacturing a composite lead frame.
Figure 4:
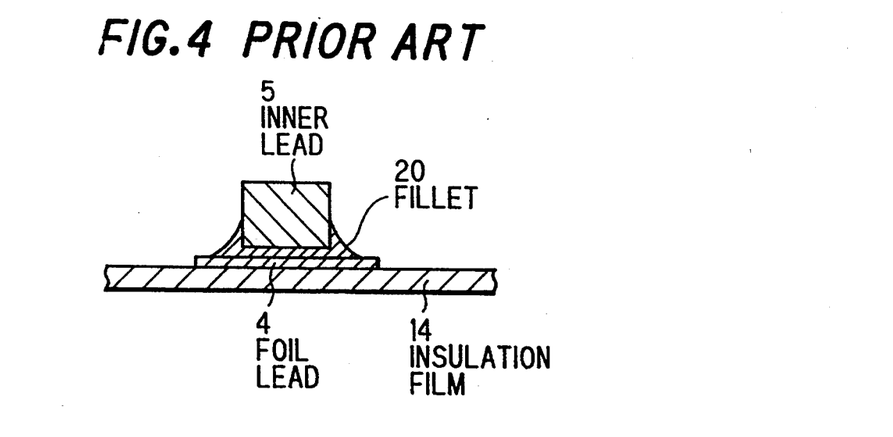
FIG. 4 is a cross sectional view showing a connected portion of a conventional composite lead frame.

In forming the Au—Sn eutectic layer, a lower plating layer of Ni having a thickness of 2 to 3 $\mu$m and an upper plating layer of Au having a thickness of 0.5 to 1.0 $\mu$m are provided on the copper foil lead 4, and a Sn plating layer of a 7 to 10 $\mu$m thickness is provided on a tip portion surface of the inner lead 5. The lower and upper plating layers are not shown, while the Sn plating layer is indicated by a reference numeral 13, as shown in FIG. 3. Then, a heating tool 19 is applied on an upper tip portion of the inner lead 5. Consequently, the copper foil lead 4 and the inner lead 5 are joined with a fillet 20, as shown in FIG. 4.

As clearly understood from the illustration of FIG. 3, the heating tool 19 is contaminated on its pressing surface by the Sn plating layer 13. As a result, the heating tool 19 is required to be cleaned, preferably, at each time.

In order to eliminate the cleaning of the heating tool 19, the pressing surface of tile heating tool 19 may be covered by diamond. However, this results in the cost increase of the heating tool 19, and, even if diamond is used, minor amount of Sn particles are adhered to the heating tool 19, so that the cleaning thereof becomes necessary approximately several times in one hundred pressing works.

Figure 5:
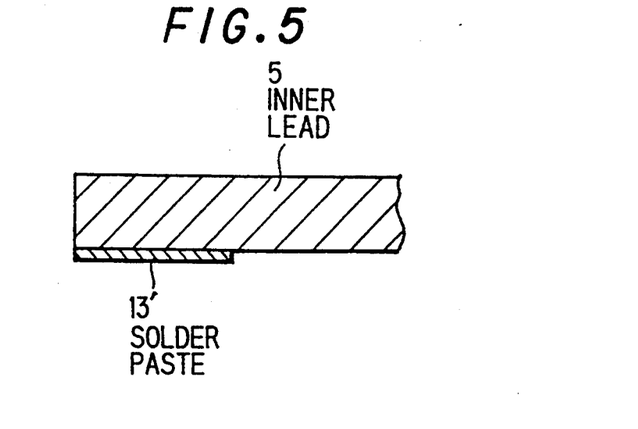
FIG. 5 is a cross sectional view showing a conventional inner lead covered by solder paste.

For this reason, solder paste 13' is preferably provided only on the bottom surface of the inner lead 5, as shown in FIG. 5. According to this method, however, the solder paste 13' becomes shortage in amounts. This results in a disadvantage in that the fillet 20 is not appropriately formed. In addition, there is another disadvantage in that the inner lead 5 which is usually made of copper alloy or Fe—42% Ni alloy is thermally oxidized on surfaces which are not covered by the solder paste 13' to provide oxidation films thereon in accordance with the temperature increase by the heating tool 19. This lowers the formation of the fillet 20. As a result, the tensile strength of the connection between the copper foil lead 4 and the inner lead 5 is lowered to one-half without the formation of the fillet 20.

Figure 6:
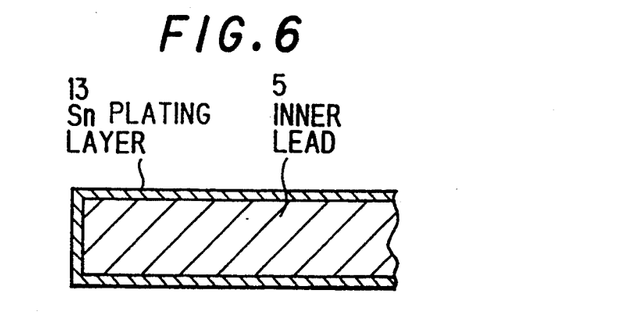
FIG. 6 is a cross sectional view showing an inner lead proposed by the inventor.

On the other hand, if the inner lead 5 is covered on its whole surface with a Sn plating layer 13, as shown in FIG. 6, the Sn plating layer 13 is melted to flow on an insulation film, on which copper foil leads 4 are patterned, at the time of connecting the inner lead 5 to the copper foil lead 4, in accordance with heat of the heating tool 19. As a result, neighboring inner leads 5 or copper foil leads 4 tend to be short-circuited.

In accordance with the background of the invention as described above, the invention in which the contamination of a heating tool is eliminated, when an FPC (or TAB tape) and a lead frame are connected, and a predetermined strength of connection portions is obtained, has been proposed as fully explained below.

Figure 7:
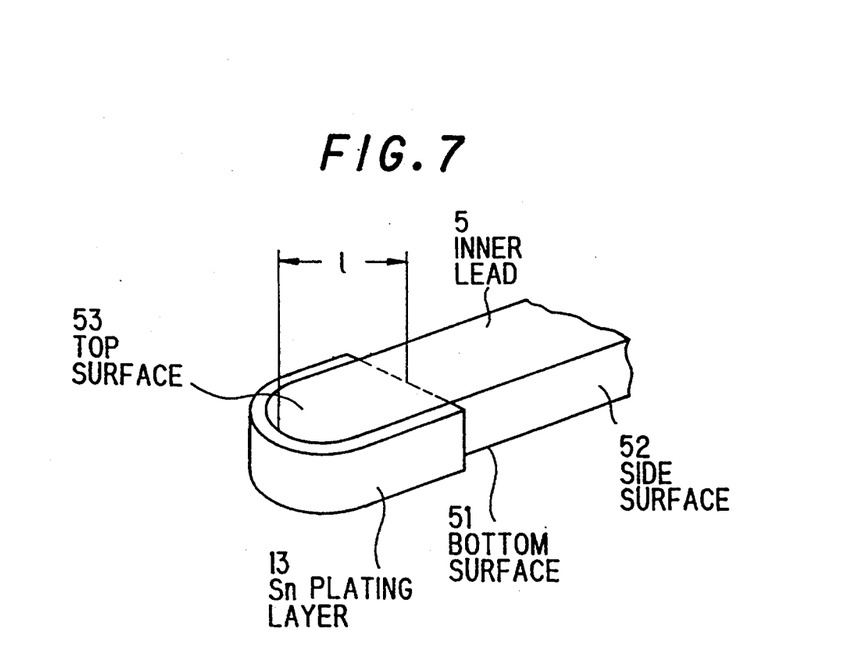
FIG. 7 is a perspective view showing an inner lead in a method for manufacturing a composite lead frame of a preferred embodiment according to the invention.
Figure 8:
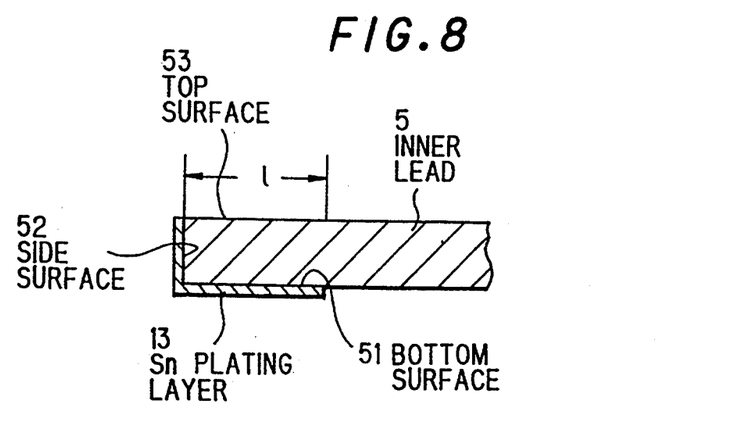
FIG. 8 is a cross sectional view showing the inner lead of FIG. 7.

FIGS. 7 and 8 show an inner lead 5 in a method for manufacturing a composite lead frame of a preferred embodiment according to the invention, by which the composite lead frame 100 is manufactured, as shown in FIG. 1.

Figure 9:
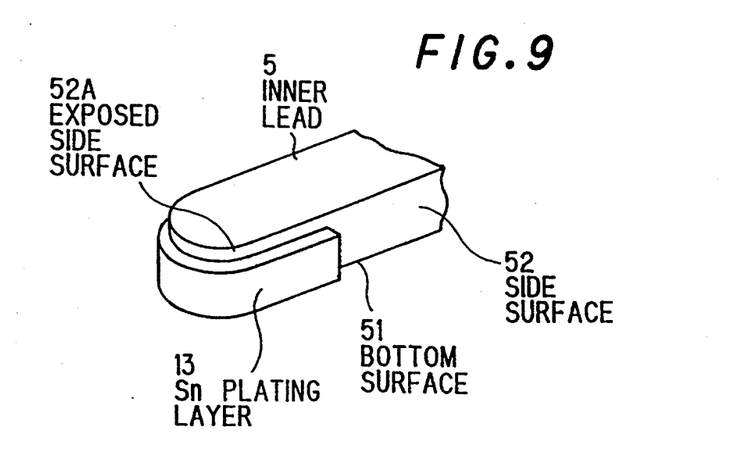
FIG. 9 is a perspective views showing another inner lead in a method for manufacturing a composite lead frame of the preferred embodiment.

As shown in FIGS. 7 and 8, the inner lead 5 is provided on only a tip portion of its side and bottom surfaces 51 and 52 with a Sn plating layer 13, while no Sn plating layer is applied on a top surface of the inner lead 5. More preferably, the Sn plating layer 13 which is provided on the side surface 52 of the inner lead 5 is limited to expose an upper portion 52A of the side surface 52 of the inner lead 5, as shown in FIG. 9.

In this preferred embodiment, the inner lead 5 is made of oxide free copper (OFC) containing Zr by a weight ratio of 0.15% and having a thickness of 0.15 mm and a width of 0.20 mm.

In FIGS. 7 and 8, the length l along which the Sn plating layer 13 is provided is 2.5 mm, and a thickness of the Sn plating layer 13 is 10 $\mu$m.

Figure 10:
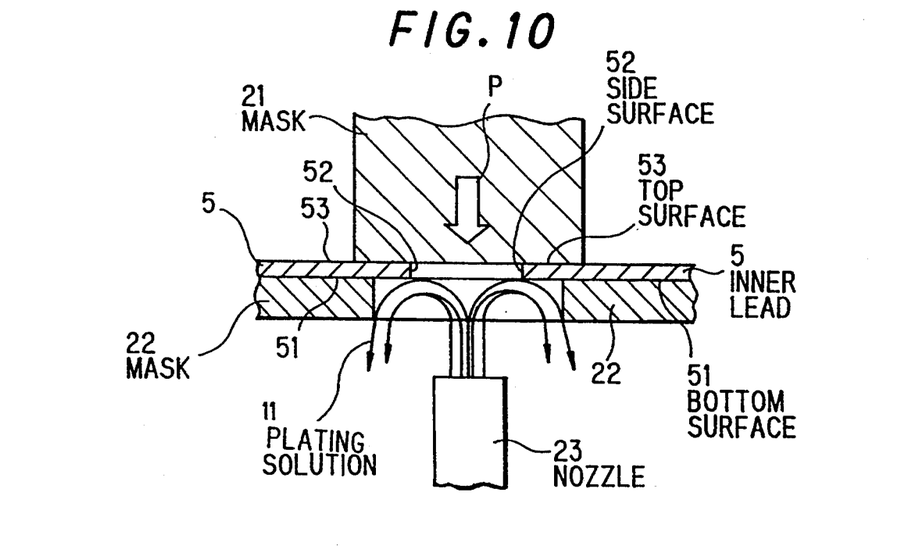
FIG. 10 is a cross sectional view showing how the inner lead of FIGS. 7 and 8 is plated.

FIG.10 shows a method for applying the Sn plating layer 13 on the tip portion of the inner lead 5, as shown in FIGS. 7 and 8.

In this method, the inner leads 5 are protected to be exposed on the tip portion of the side and bottom surfaces 51 and 52 by a top surface mask 21 and bottom surface masks 22.

Although not shown, an anode of Pt wire is provided afterwards a nozzle 23, while the inner leads 5 are connected to a cathode, wherein Sn plating solution 11 of alkanole sulfonic acid is supplied from the nozzle 23 to the exposed side and bottom surfaces 51 and 52 of the inner leads 5 for 40 seconds.

A metal lead frame 50 having inner leads 5 thus provided with Sn plating layers 13 and an FPC 2 are connected via a junction region 3, wherein each of copper foil leads 4 is provided thereon with a lower plating layer of Ni having a thickness of 3 to 4 μm and an upper plating layer of Au having a thickness of 1.0 μm, as described before.

In making a junction of the inner leads 5 provided on the four sides of the metal lead frame 50 with the patterned copper foil leads 4 provided on the four sides of the FPC 2, a heating tool 19 (for instance, as shown in FIG. 3) which is common to all of the inner leads 5 and the copper foil leads 4 and has a heating temperature of 330° C. is used to apply predetermined heat and pressure on the junction region 3 for 4 seconds.

In the examination of the heating tool 19 after the joining process as described above, no contamination of the Sn plating layer 13 is found thereon.

In place of the inner lead 5 as shown in FIGS. 7 and 8, the inner lead 5 of FIG. 9 is used. This inner lead 5 is obtained in the arrangement of FIG. 10 by using an elastic top surface mask 21 to shield an upper portion of the side surface 52 of the inner lead 5 in accordance with the application of a pressure as indicated by an arrow P in FIG. 10.

In the examination of the heating tool 19, the surface contamination thereof is more decreased than in the case of using the inner lead 5 of FIGS. 7 and 8.

In the modification of the preferred embodiment, a Sn plating layer is replaced by a solder plating layer. In order to provide the solder plating layer, alkanole sulfonic acid Sn—Pb alloy plating solution is used, wherein a composition and a plating condition of the plating solution is determined to provide a content of Pb by a weight ratio of 5% for the plated layer. In accordance with the addition of Pb, the occurrence of Sn whisker is avoided.

Figure 11:
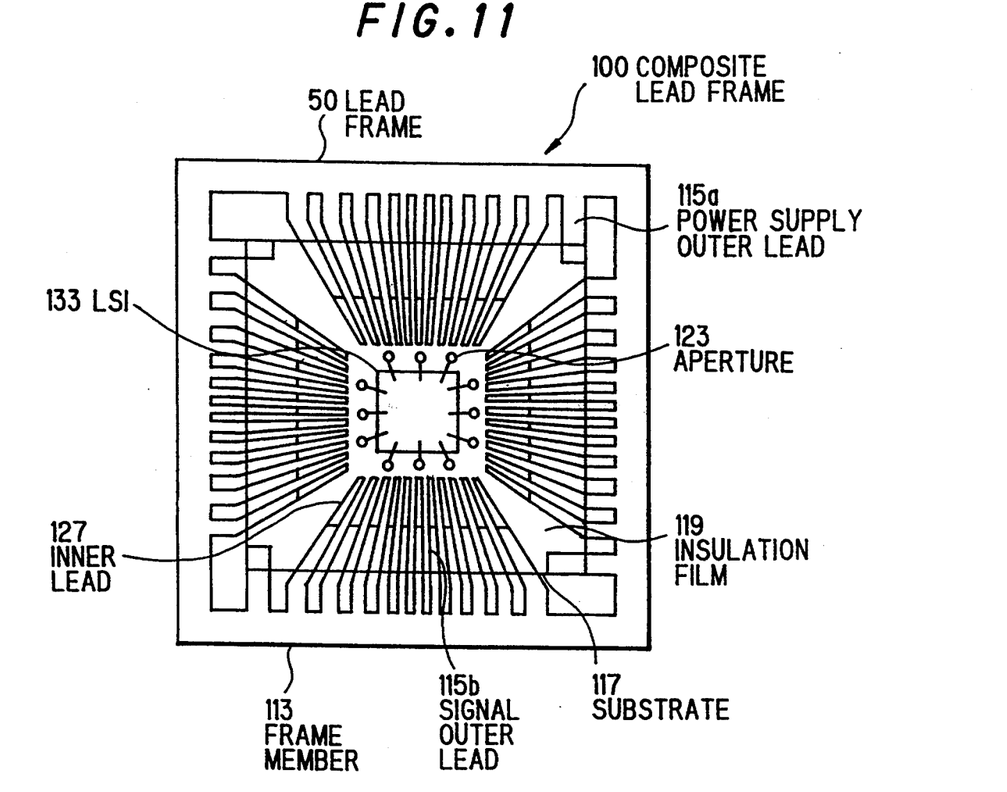
FIG. 11 is a plan view showing a composite lead frame to which the invention relates.

Next, a composite lead frame of a preferred embodiment according to the invention will be explained in FIGS. 11 and 12.

The composite lead frame is indicated by a reference numeral 100, and comprises a metal lead frame 50 and a flexible multi-layered wire substrate 117. The lead frame 50 comprises a frame number 113, outer leads 115a for a power supply ($V_{CC}$, $V_{DD}$ or ground), and outer leads 115b for signals. The flexible multi-layered wire substrate 117 comprises an insulation film 119 such as polyimide resin, a conductive layer 121 such as copper for a power supply (or ground), and inner leads 127 patterned on the insulation film 119 which is formed with apertures 123 by press-punching, etc. The insulation film 119 and the conductive layer 121 are bonded by adhesive, and the inner leads 127 are obtained by etching of copper foil provided on the insulation film 119. The inner leads 127 may be provided on the insulation film 119 by vapor deposition. On a tip portion of a top surface of each inner lead 127, a lower Sn—Ni plating layer and an upper Au plating layer are formed to provide better wire bonding property. The same plating layers are formed at least on the surfaces of the conductive layer 121 exposed by the apertures 123. In the center of the flexible multi-layered wire substrate 117, an LSI 133 is positioned to be connected to the inner leads 127 and via the apertures 123 to the conductive layer 121 by binding wires 135.

In this composite lead frame 100, the lead frame 50 is made of a Fe—42% Ni alloy plate having a thickness of 0.15 mm, such that a pitch of the outer leads 15b is 0.37 mm at the leading edge thereof. Further, the flexible multi-layered wire substrate 117 is fabricated, for instance, by forming the apertures 123 on the insulation film 119 of polyimide resin having a thickness of 0.05 mm, adhering the conductive layer 121 of a Fe—42% Ni alloy foil having a thickness of 0.10 mm on a first surface of the insulation film 119, adhering a copper foil having a thickness of 0.018 mm on a second surface of insulation film 119, and etching the copper foil to provide the inner leads 127 having a pitch of 0.12 mm.

In this flexible multi-layered wire substrate 119, a lower plating of Ni having a thickness of 0.5 μm and an upper plating of Au having a thickness of 2.0 μm are formed on the outside edges of the inner leads 127, and, in the metal lead frame 50, a plating layer of Sn having a thickness of 7.5 μm is formed on the junction surfaces of the outer leads 115b. Here, the weight ratio of Au and Sn is 26% and 74% in the plating layers.

Figure 12:
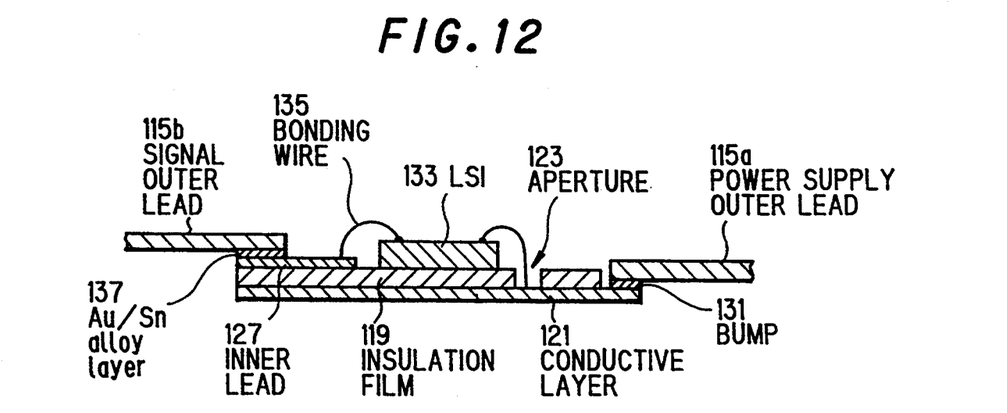
FIG. 12 is a cross sectional view showing a part of the composite lead frame.

In FIG. 12, the signal outer lead 115b is connected to the inner lead 127 by a Au—Sn alloy layer 137, and the power supply outer lead 115a is connected to the conductive layer 121 by a Au—Sn alloy layer 131, in the same manner as in the signal alloy layer 131, in the same manner as in the signal outer lead 115b.

In making a junction of the outer leads 115b with the inner leads 127, heat and pressure are applied across the inner and outer leads 127 and 115b. In this junction process, each parameter is set as follows;

| (a) temperature: | 320° C. |
| (b) pressure: | 40 g/one lead |
| (c) time: | 10 seconds |

As a result, a content of Au is 15% in the Au—Sn alloy layer 37.

In the composite lead frame 100 thus manufactured, no carbonization and oxidation are found in the insulation film 119 in the vicinity of connected portions of the outer leads 115b and the inner leads 127.

Figure 13:
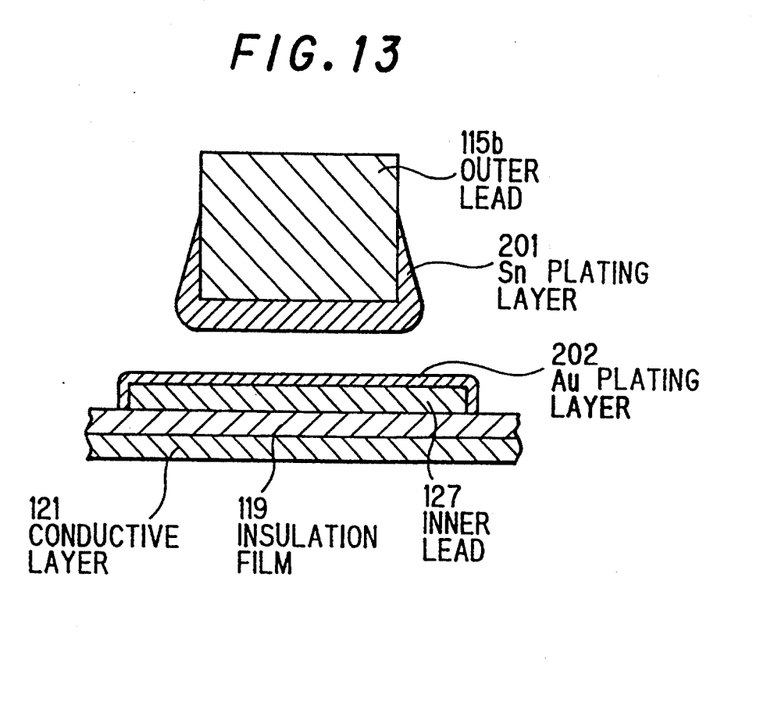
FIG. 13 is a cross sectional view showing inner and outer leads prior to the connection thereof which is a part of a composite lead frame of a preferred embodiment according to the invention.

FIG. 13 shows the outer lead 115b having the Sn plating layer 201 and the inner lead 127 having the Au plating layer 202 prior to applying heat and pressure thereto, although the Ni plating layer is, not shown on the inner lead 127, wherein the inner lead 127 is provided on the insulation film 119 having the conductive layer 121 on the back surface thereof.

Figure 14:
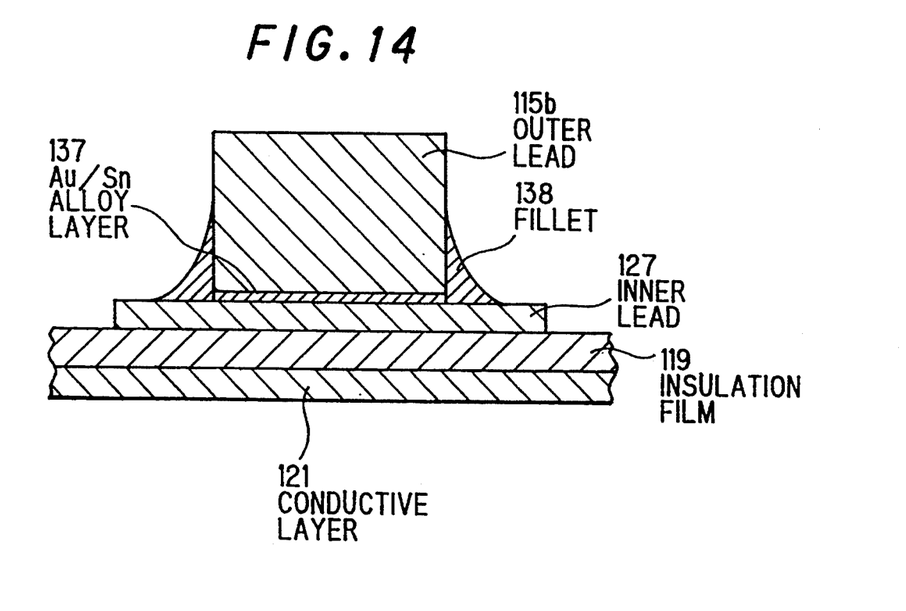
FIG. 14 is a cross sectional view showing the inner and outer leads connected by a Au—Sn alloy layer which is a part of the composite lead frame of FIG. 13, FIGS. 15 to 19 are graphs showing characteristics of the connected inner and outer leads of FIG. 14.

FIG. 14 shows the inner and outer leads 127 and 115b connected by the Au—Sn alloy layer 137 having the fillet 138, wherein like parts are indicated by like reference numerals as used in FIG. 13.

Figure 15:
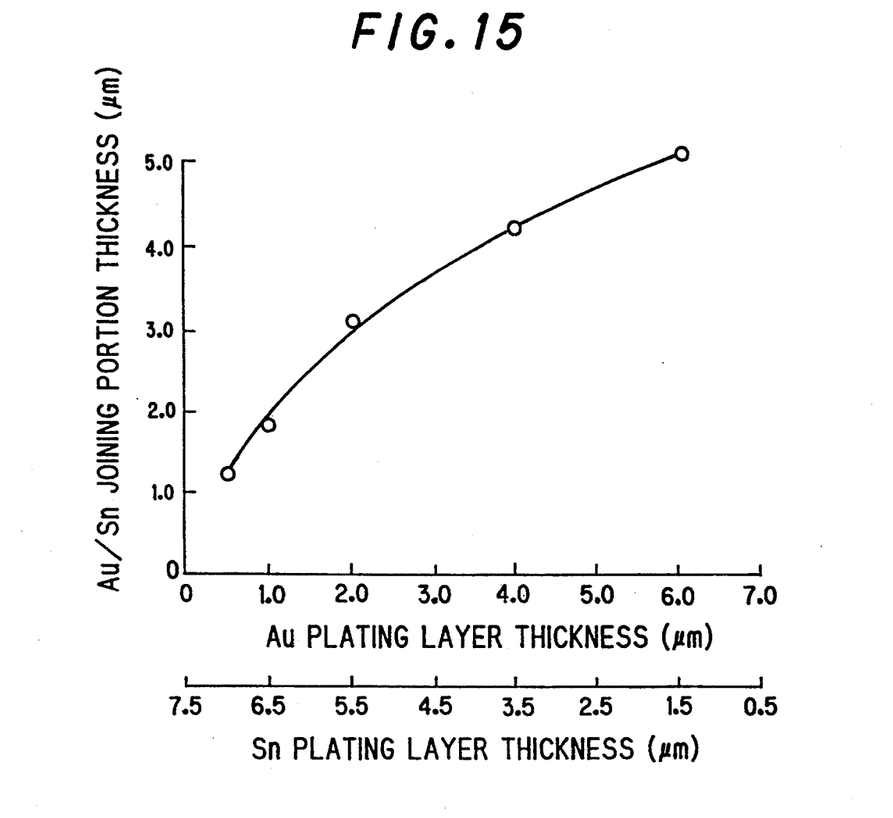

FIG. 15 shows the result of an experiment in which a cross sectional thickness of a Au—Sn joining portion between the inner and outer leads 127 and 115b is measured relative to a thickness ratio of the Au plating layer 202 and the Sn plating layer 201 according to the structure as shown in FIG. 14, wherein in a total thickness of the Au and Sn plating layers 202 and 201 is fixed to be 7.5 μm. As understood from the result, as the Au plating layer 202 becomes thick, the cross sectional thickness becomes thick. This is because the Au plating layer 202 remains non-reacted with the Sn plating layer 201, when a heating temperature is not sufficiently high at the time of applying a pressure thereto.

Figure 16:
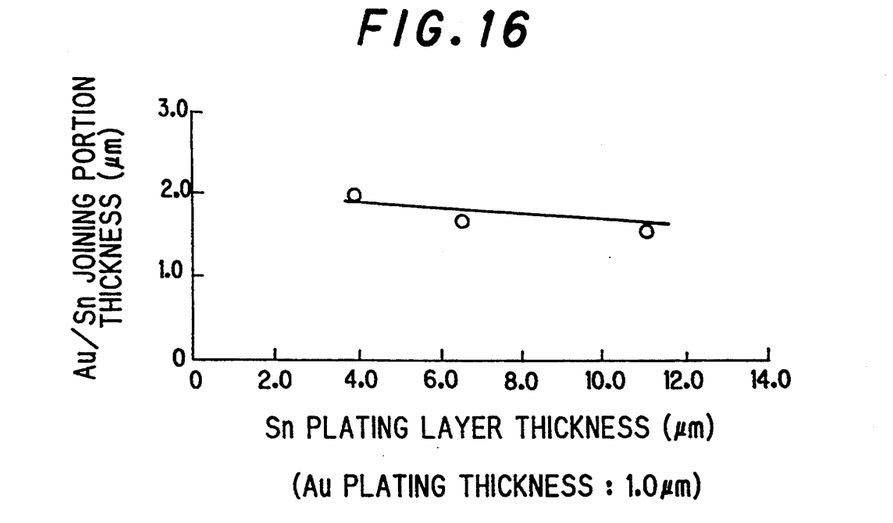

On the other hand, when a thickness of the Au plating layer 202 is constant to be as small as 1.0 μm, the cross sectional thickness is approximately constant to be 4.0 μm as shown in FIG. 16.

Figure 17:
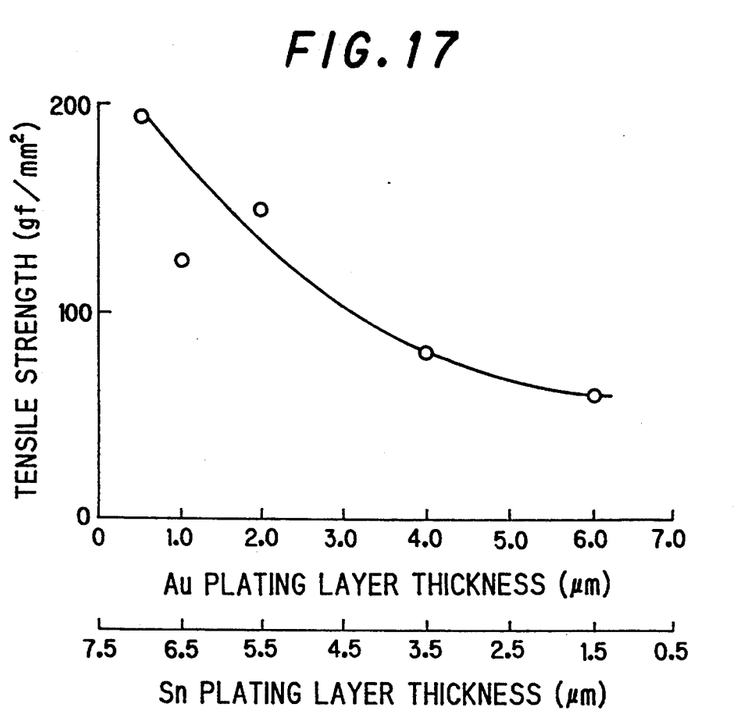

FIG. 17 shows the result of an experiment in which a tensile strength of a Au—Sn joining portion between the inner and outer leads 127 and 115b is measured relative to a thickness ratio of the Au plating layer 202 and the Sn plating layer 201 (FIG. 14), wherein a total thickness of the Au and Sn plating layer 202 and 201 is fixed to be 7.5 μm in the same manner as in the former experiment. It is confirmed in this experiment that when the Au plating layer 202 ranges in thickness from 0.5 to 2.0 μm, the tensile strength is large.

Figure 18:
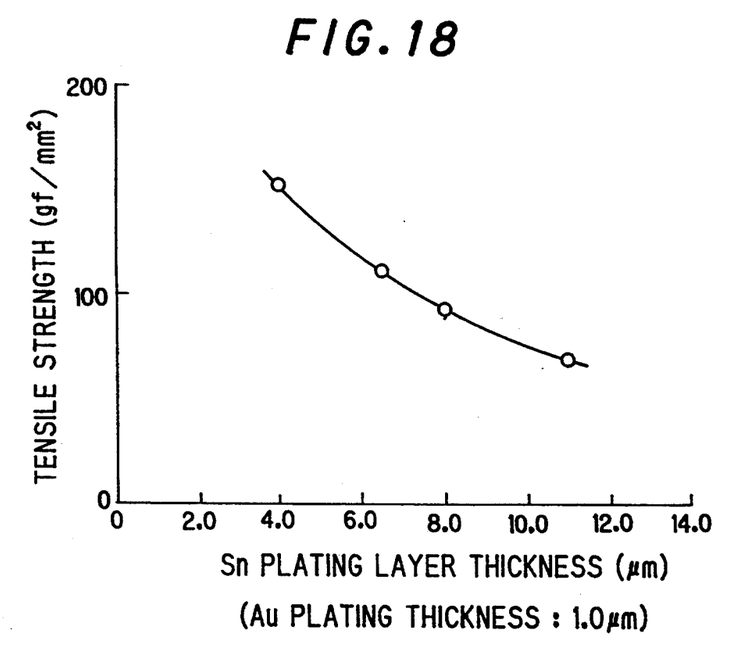

On the other hand, when a thickness of the Au plating layer 202 is constant to be as small as 1.0 μm, the tensile strength is satisfactory to be large by a thickness of the Sn plating layer 201 ranging from 4.0 to 8.0 μm, as shown in FIG. 18.

Figure 19:
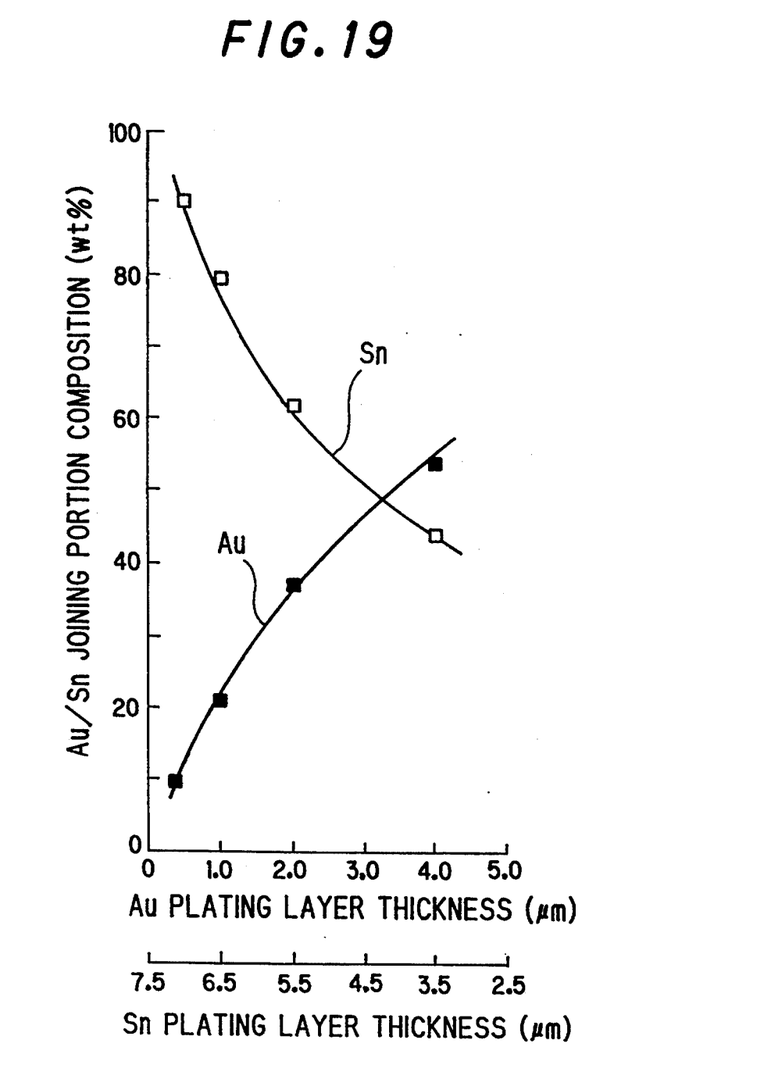

FIG. 19 shows the results of quantitative analysis in which the amount of Au and Sn in the joining portion between the inner and outer leads 127 and 115b is measured in weight relative to a thickness ratio of the Au and Sn plating layers 202 and 201 (FIG. 14), wherein a total thickness of the both layers 201 and 202 is fixed to be 7.5 μm. In accordance with the comparison between the results of FIGS. 17 and 19, an alloy composition containing Au of 10 to 40 weight % is determined to provide a large tensile strength.

Figure 20:
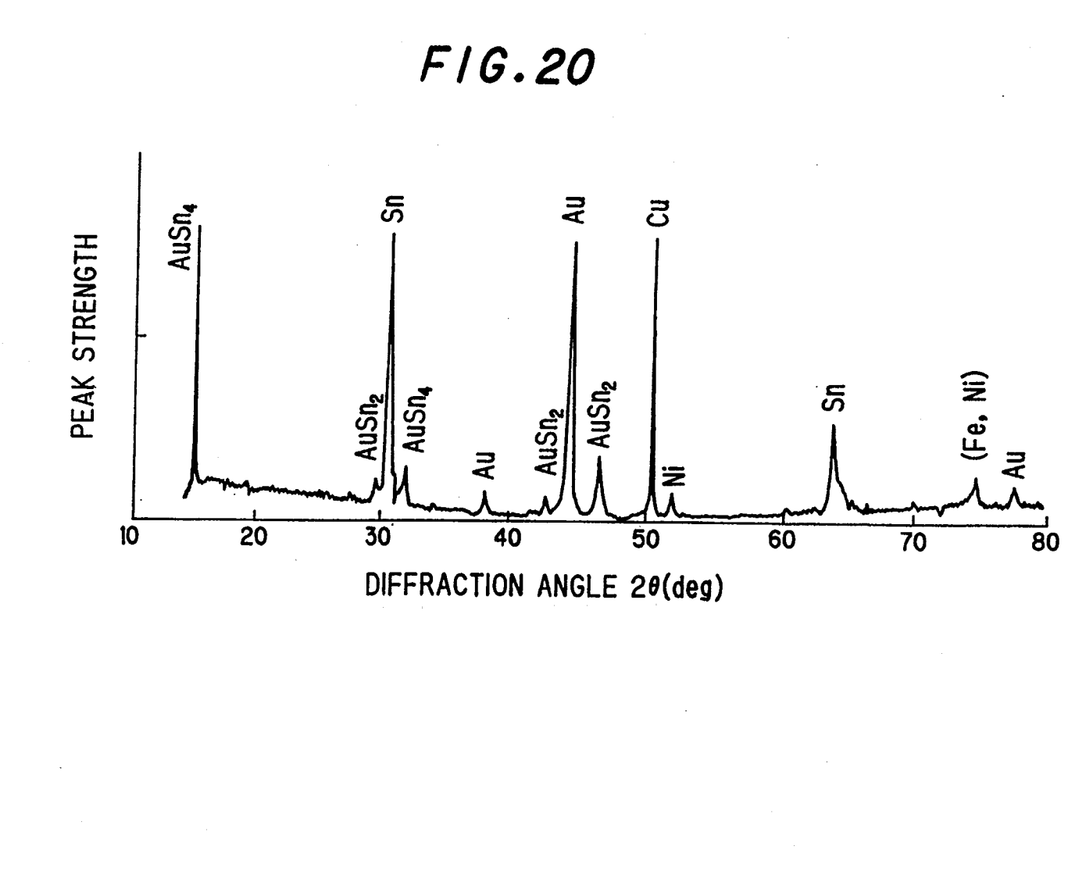
FIG. 20 is a diagram showing the result of an infrared rays analysis of the connected inner and outer leads of FIG. 14.

FIG. 20 shows the result of X-ray diffraction analysis on the Au—Sn joining portion of an alloy composition containing Au of 20 weight % between the inner and outer leads 127 and 115B. This shows no generation of intermatalic compound which is brittle to be indicated by AuSn. The same analysis is carried out on those containing Au of 10 and 40 weight %, and the same results are obtained.

Figure 21:
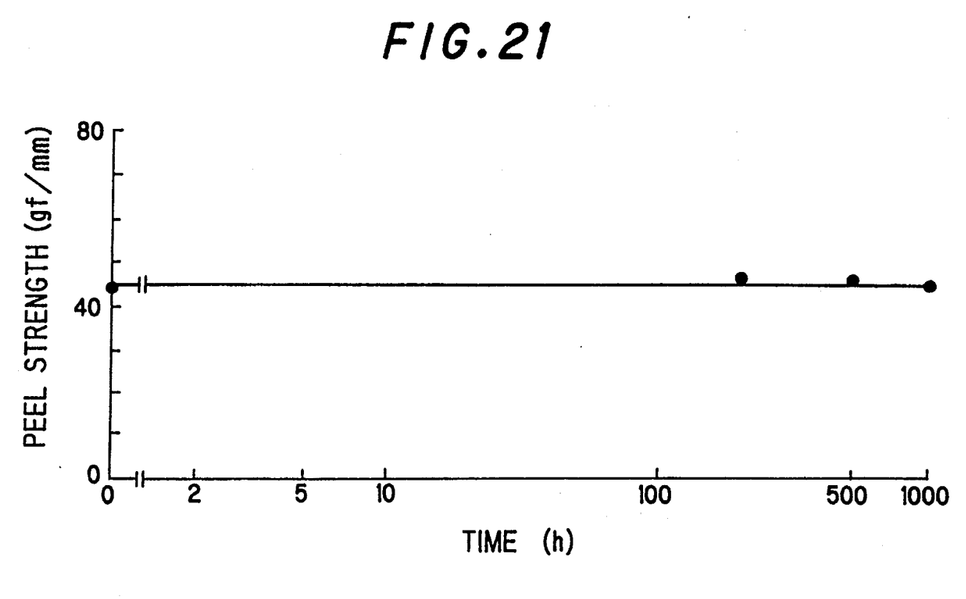
FIG. 21 is a graph showing the result of a high temperature exposure test of the connected inner and outer leads of FIG. 14.

FIG. 21 shows the result of a high temperature exposure test in which the Au—Sn joining portion of alloy compositions containing Au of 10 to 40 weight % is exposed to a temperature of 150° C. for 1000 hours to be checked in peeling strength between the inner and outer leads 127 and 115b (FIG. 14). As a result, no deterioration is found in peeling strength.

As to the same kind of samples, a temperature cycle test in which the samples are held at a temperature of −30° C. for 30 minutes and at a temperature of 150° C. for 30 minutes for one cycle and this cycle is repeated by 1000 times is carried out.

As a result, no deterioration is found in peeling strength.

the above preferred embodiment, a Au plating layer may be provided directly on an inner lead by omitting a Ni plating layer.

As a heating apparatus in making a junction of outer leades with inner leads, an infrared rays heater, an electric heater, etc. may be used, and a temperature of a heater may range 300° to 500° C., by which inner and outer leads are applied with a pressure of 31 to 94 g for 0.5 to 20 seconds.

A thickness of Au plating layers provided on inner leads may range 0.3 to 60 μm, preferably 0.5 to 2. μm, and Ni plating layers provided thereunder may range 0.1 to 1.5 μm in thickness, while Sn plating layers provided on outer leads may range 1.5 to 7.5 μm.

As a plating method for Au, an or Ni, an electroplating may be used, and, for Au plating, a neutral bath or an acid bath is used by adopting semi-gloss plating, while non-gloss plating is adopted for Sn plating by using a sulfuric acid bath or a boron fluoride bath. Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. In a method for manufacturing a composite lead frame by joining an outer lead and an inner lead with a Au—Sn eutectic alloy, wherein the outer lead is of a metal frame and the inner lead is of a conductive lead pattern on an insulating film, the method comprising the steps of:
providing a Sn-plating layer on a joining surface of one of said outer and inner leads;
providing a Au-plating layer on a joining surface of a remaining one of said outer and inner leads; and
applying heat and pressure to joining surfaces of said outer and inner leads in contact with each other to be joined with said Au—Sn eutectic alloy, said Au—Sn alloy containing 10 to 40 weight % of Au.

2. A method for manufacturing a composite lead frame according to claim 1, wherein said Sn-plating layer is provided on a bottom surface and a side surface of a tip portion of said inner lead, said an outer lead being supported by a frame member of the metal frame; and further comprising positioning said tip portion of said inner lead on a patterned lead of a flexible lead-patterned substrate, said bottom surface facing said patterned lead of said flexible lead-patterned substrate, and said lead-patterned substrate comprising said insulation film and a plurality of patterned leads including said patterned lead provided on said insulation film; and applying said heat and pressure across said tip portion of said inner lead and said patterned lead by a heating tool.

3. A method for manufacturing a composite lead frame, according to claim 2, wherein:
said step of providing said Sn-plating layer includes providing said Sn-plating layer on said side surface excluding a limited portion adjacent to a top surface of said inner lead.

4. A method for manufacturing a composite lead frame, according to claim 2, further comprising the step of:
providing a plating layer on said patterned lead, said plating layer comprising a first layer of Ni provided on said patterned lead, and a second layer of Au provided on said first layer.

5. In a method for manufacturing a composite lead frame by joining an outer lead and an inner lead with a Au—Sn eutectic alloy, wherein the outer lead is of a metal lead frame and the inner lead is of a conductive lead pattern on an insulating film, the method comprising the steps of:
providing a Sn-plating layer on a joining surface of said outer lead;
providing a Au-plating layer on a joining surface of said inner lead; and
applying heat and pressure to joining surfaces of said outer and inner leads in contact with each other to be joined with said Au—Sn eutectic alloy, said Au—Sn alloy containing 10 to 40 weight % of Au.

6. A method for manufacturing a composite lead frame according to claim 5, wherein said Sn-plating layer is provided on a bottom surface and a side surface of a tip portion of said inner lead, said outer lead being supported by a frame member of the metal frame; and further comprising positioning said tip portion of said inner lead on a patterned lead of a flexible lead-patterned substrate, said bottom surface facing said patterned lead of said flexible lead-patterned substrate, and said lead-patterned substrate comprising said insulation film and a plurality of patterned leads including said patterned lead provided on said insulation film; and applying said heat and pressure across said tip portion of said inner lead and said patterned lead by a heating tool.

7. A method for manufacturing a composite lead frame, according to claim 6, wherein:

said step of providing said Sn-plating layer includes providing said Sn-plating layer on said side surface excluding a limited portion adjacent to a top surface of said inner lead.

8. A method for manufacturing a composite lead frame, according to claim 6, further comprising the step of:

providing a plating layer on said patterned lead, said plating layer comprising a first layer of Ni provided on said patterned lead, and a second layer of Au provided on said first layer.

* * * * *